United States Patent
Tang et al.

(10) Patent No.: US 8,330,239 B2
(45) Date of Patent: Dec. 11, 2012

(54) SHIELDING FOR A MICRO ELECTRO-MECHANICAL DEVICE AND METHOD THEREFOR

(75) Inventors: Jinbang Tang, Chandler, AZ (US); Lianjun Liu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 137 days.

(21) Appl. No.: 12/432,289

(22) Filed: Apr. 29, 2009

(65) Prior Publication Data

US 2010/0276766 A1 Nov. 4, 2010

(51) Int. Cl.
*G01L 9/00* (2006.01)

(52) U.S. Cl. .............. 257/419; 257/690; 257/E23.061; 257/E29.324; 257/E21.499; 257/E21.509; 438/51

(58) Field of Classification Search .......... 257/419, 257/690, E23.061, E29.324, E21.499, E21.509; 438/51
See application file for complete search history.

(56) References Cited

U.S. PATENT DOCUMENTS

| | | | |
|---|---|---|---|
| 4,555,630 A | 11/1985 | Sheets et al. | |
| 6,521,513 B1 | 2/2003 | Lebens et al. | |
| 6,522,762 B1 | 2/2003 | Mullenborn et al. | |
| 6,675,472 B1 | 1/2004 | Huang et al. | |
| 6,781,231 B2 | 8/2004 | Minervini | |
| 6,788,795 B2 | 9/2004 | Scheeper et al. | |
| 7,166,910 B2 | 1/2007 | Minervini | |
| 7,202,552 B2 | 4/2007 | Zhe et al. | |
| 7,242,089 B2 | 7/2007 | Minervini | |
| 7,381,589 B2 | 6/2008 | Minervini | |
| 2003/0128854 A1* | 7/2003 | Mullenborn et al. | 381/174 |
| 2004/0016995 A1* | 1/2004 | Kuo et al. | 257/678 |
| 2004/0091125 A1* | 5/2004 | Choe et al. | 381/111 |
| 2007/0009111 A1 | 1/2007 | Stenberg et al. | |
| 2007/0041597 A1 | 2/2007 | Song | |
| 2007/0165888 A1 | 7/2007 | Weigold | |
| 2008/0075309 A1 | 3/2008 | Chen et al. | |
| 2008/0175417 A1* | 7/2008 | Kok et al. | 381/174 |
| 2008/0185699 A1 | 8/2008 | Wang | |
| 2009/0169035 A1 | 7/2009 | Rombach et al. | |

OTHER PUBLICATIONS

U.S. Appl. No. 12/432,377 filed Apr. 29, 2009, Office Action-Rejection, mailed Aug. 11, 2011.
U.S. Appl. No. 12/432,377, Office Action, Notice of Allowance, Statement of Reasons for Allowance, dated Feb. 13, 2012.

* cited by examiner

*Primary Examiner* — Jami M Valentine
(74) *Attorney, Agent, or Firm* — Daniel D. Hill

(57) ABSTRACT

A device comprises a conductive substrate, a micro electro-mechanical systems (MEMS) structure, and a plurality of bond pads. The conductive substrate has a first side and a second side, the second side opposite the first side. The MEMS structure is formed over the first side of the conductive substrate. The plurality of bond pads are formed over the first side of the conductive substrate and electrically coupled to the first side of the conductive substrate. The conductive substrate and plurality of bond pads function to provide electrostatic shielding to the MEMS structure.

13 Claims, 2 Drawing Sheets

SHIELDING FOR A MICRO ELECTRO-MECHANICAL DEVICE AND METHOD THEREFOR

CROSS-REFERENCE TO RELATED APPLICATION(S)

This application is related to U.S. patent application Ser. No. 12/432,377, filed on even date, entitled "MEMS Microphone With Cavity and Method Therefor", naming Lianjun Liu and Douglas Mitchell as inventors, and assigned to the current assignee hereof.

BACKGROUND

1. Field

This disclosure relates generally to micro electro-mechanical systems (MEMS), and more specifically, to shielding for a MEMS device and method therefor.

2. Related Art

Micro electromechanical systems (MEMS) components are increasingly being used in a wide variety of applications, especially where the demand for miniaturized structures is called for. Typically, a MEMS component is a miniaturized device having a movable structure suspended from a substrate, and associated circuitry that both senses movement of the suspended structure and delivers the sensed movement data to one or more external devices for processing. MEMS devices can be implemented as accelerometers to selectively deploy air bags in automobiles, as gyroscopes to detect rotation rates in airplanes, as microphones to convert audible signals to electrical signals, and so forth. The use of MEMS microphones, rather than conventional condenser microphones, has come to be appreciated for their small package profile and compatibility with surface mount techniques and automated pick-and-place equipment.

MEMS components are typically fabricated on semiconductor wafers. A MEMS component may be fabricated in or on a semiconductor wafer using standard integrated circuit fabrication equipment. Once the wafer is processed, it is diced to form individual die. Each singulated die is packaged, and the MEMS component may be inserted into a socket or bonded to a non-semiconductor substrate, such as a printed circuit board (PCB) as part of an overall system.

In some applications, shielding is used to isolate radio frequency (RF), electrostatic noise, and electro-magnetic interference (EMI) from the MEMS device. Typically, a metalized cover is fitted over the MEMS device for this purpose. In the case of a MEMS microphone, an acoustic hole in the cover allows sound in.

MEMS fabrication and packaging can have a significant impact on the ability of such MEMS components to penetrate cost-sensitive markets, such as the cellular telephone industry. For example, the metalized cover over the MEMS microphone increases both the size and cost of the device.

Therefore, what is needed is a MEMS device that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
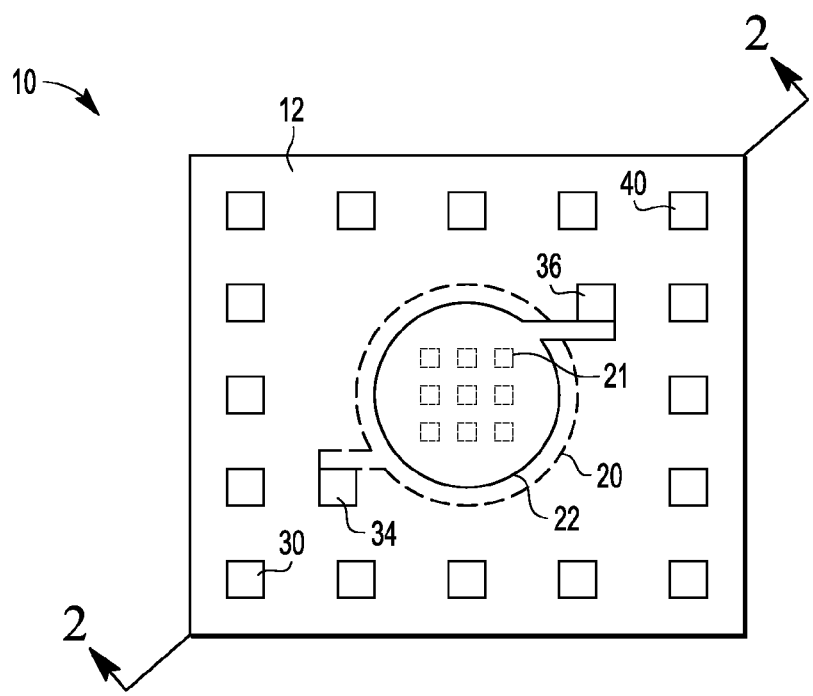
FIG. 1 illustrates a top down view of a MEMS device in accordance with an embodiment.

Generally, there is provided, a MEMS device having a MEMS body, or structure, that is formed from highly conductive silicon. The MEMS device is mounted on a printed circuit board (PCB). A ring of interconnects is formed in and on one side of the MEMS device. Also, patterned shield planes are formed on the PCB. The ring of interconnects are connected to the PCB. The highly conductive silicon, the ring of interconnects, and the patterned shield planes form a shield around the MEMS device to reduce the effects of RF noise, electrostatic noise, and EMI. Using the highly conductive silicon, ring of interconnects, and patterned shield planes to form the shield eliminate the need for a separate cover over the MEMS device, thus reducing the size and cost of the MEMS device. In the illustrated embodiment, the MEMS device is a MEMS microphone.

The semiconductor substrate described herein can be any semiconductor material or combinations of materials, such as gallium arsenide, silicon germanium, silicon-on-insulator (SOI), silicon, monocrystalline silicon, the like, and combinations of the above.

In one aspect, there is provided a device comprising: a conductive substrate having a first side and a second side, the second side opposite the first side; a micro electro-mechanical systems (MEMS) structure formed over the first side of the conductive substrate; and a plurality of bond pads formed over the first side of the conductive substrate and electrically coupled to the first side of the conductive substrate. The conductive substrate may further comprise a cavity directly opposite the MEMS structure. The MEMS structure may include a diaphragm for a microphone. The device may be flip-chip mounted to a printed circuit board (PCB), and wherein each of the plurality of bond pads is electrically coupled to a ground terminal of the PCB. The PCB may further comprise a patterned metal layer coupled to the ground terminal of the PCB, and wherein the patterned metal layer, the plurality of bond pads, and the conductive substrate together form an electrostatic noise shield around the MEMS structure. The device may further comprise a second device flip-chip mounted to the PCB, the second device comprising a second conductive substrate. The PCB may further comprise an acoustic hole positioned to admit sound to the microphone diaphragm. The conductive substrate may have a resistivity of less than or equal to 0.02 ohm-centimeter. The conductive substrate may comprise doped silicon.

In another aspect, there is provided, a device comprising: a conductive substrate having a first side and a second side, the second side opposite the first side, a cavity formed in the conductive substrate and having an opening on the first side; a micro electro-mechanical systems (MEMS) microphone diaphragm formed over the opening on the first side, the MEMS microphone diaphragm electrically isolated from the conductive substrate; a microphone backplate formed over and electrically isolated from the MEMS microphone diaphragm on the first side of the conductive substrate; and a plurality of bond pads formed over the conductive substrate on the first side and around the MEMS microphone diaphragm, each of the plurality of bond pads electrically coupled to the conductive substrate. The conductive substrate may comprise doped silicon having a resistivity less than or equal to 0.02 ohm-centimeter. The device may be solder mounted to a printed circuit board (PCB) via the plurality of bond pads, and wherein the PCB further comprises a ground terminal electrically coupled to the plurality of bond pads. The PCB may further comprise a patterned metal layer coupled to the ground terminal. The device may further comprise an integrated circuit mounted on the PCB, a first terminal of the integrated circuit electrically coupled to the MEMS microphone diaphragm, and a second terminal of the integrated circuit electrically coupled to the microphone backplate. The PCB may further comprise an acoustic hole positioned to admit sound to the microphone diaphragm. The conductive substrate may comprise silicon doped with a material from a group consisting of arsenic, antimony, boron, and phosphorus.

In yet another aspect, there is provided, a method for forming a device, the method comprising: providing a conductive substrate; forming a micro electromechanical (MEMS) structure over a first side of the conductive substrate and electrically isolated from the conductive substrate; forming a plurality of bond pads over the first side of the conductive substrate around the MEMS structure; and electrically coupling each of the plurality of bond pads to the conductive substrate. The step of providing the conductive substrate may further comprise: providing a silicon substrate; and doping the silicon substrate with a material selected from a group consisting of arsenic, antimony, boron, and phosphorus. The silicon substrate may be heavily doped. The method may further comprise: forming solder balls on the plurality of bond pads; attaching the plurality of bond pads to a corresponding plurality of bond pads on a printed circuit board (PCB) by reflowing the solder balls; and coupling to the corresponding plurality of bond pads to ground terminal on the PCB. The step of forming a MEMS structure may further comprise forming a MEMS microphone diaphragm. The method may further comprise forming an acoustic hole in the PCB to admit sound to the MEMS microphone diaphragm.

Figure 2:
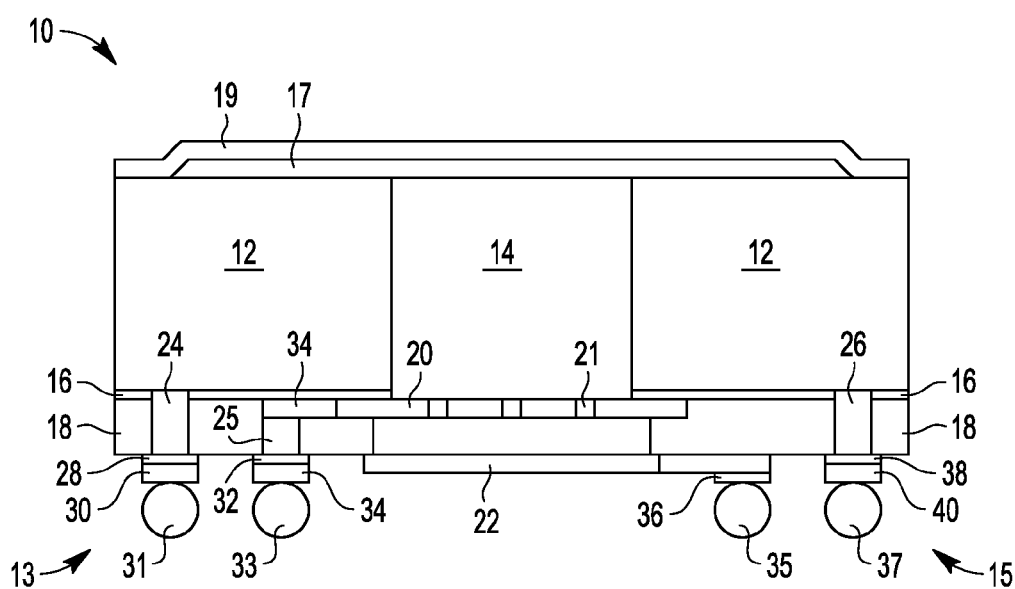
FIG. 2 illustrates a cross-sectional view of the MEMS device of FIG. 1 along the line 2-2.

FIG. 1 illustrates a top down view of a MEMS device 10 in accordance with an embodiment. FIG. 2 illustrates a cross-sectional view of MEMS device 10 of FIG. 1 along the line 2-2. In the illustrated embodiment, the MEMS device 10 is a MEMS microphone 10. The MEMS microphone 10 in accordance with the illustrated embodiment will be described by referring to both FIG. 1 and FIG. 2. MEMS microphone 10 includes a conductive substrate 12 that functions as a microphone body. In one embodiment, conductive substrate 12 is one silicon die singulated from a silicon wafer. In the illustrated embodiment, conductive substrate 12 has a resistivity of less than or equal to 0.02 ohm-centimeter and is formed from doped silicon. The silicon may be doped with one or more of arsenic, antimony, boron, and phosphorus to provide the high conductivity. In one embodiment, the silicon is heavily doped. Conductive substrate 12 has a cavity 14 formed using a silicon etch manufacturing process that is selective to oxide. Cavity 14 may be about 200 microns to 1 millimeter (mm) wide and about 725 microns deep. The depth may be established by the wafer thickness. A common thickness for 8 inch wafers is 725 microns which is a convenient dimension for the depth of cavity 14. Oxide is used as an etch stop layer that is removed by an oxide etch after the silicon etch. The conductive substrate 12 has a first side (front side) and a second side (back side) and the cavity extends from the first side to the second side. The first side is opposite the second side. A first insulating layer 16 is formed on the first side. In one embodiment, insulating layer 16 is a grown oxide layer. A polysilicon backplate 20 is formed on the first insulating layer 16 and over cavity 14 using conventional integrated circuit processing techniques. The backplate 20 has a plurality of holes 21 formed therein. Sound enters cavity 14 through holes 21. The number, size, or shape of holes 21 is not important for purposes of describing the illustrated embodiment. A second insulating layer 18 is formed on the first insulating layer 16 and over portions of backplate 20. A MEMS microphone diaphragm 22 is formed over and aligned with cavity 14 and backplate 20. The MEMS microphone diaphragm 22 is formed from polysilicon using conventional MEMS processing technologies and will not be described further. In one embodiment, backplate 20 and diaphragm 22 are electrically isolated from substrate 12 and each other by insulating layers 16 and 18. In another embodiment, backplate 20 may be electrically coupled to substrate 12. A plurality of bond pads, such as bond pads 13 and 15, form a ring around the periphery of conductive substrate 12, over the first side of conductive substrate 12, and surrounding MEMS microphone diaphragm 22 and backplate 20. Preferably the bond pads comprising the ring of bond pads are positioned apart by less than or equal to ⅛ of wavelength of the frequency of the noise signal to provide adequate shielding. Note that the ring of bond pads can comprise rectangular bond pads as illustrated in FIG. 1, circular bond pads, or can be another shape. Each bond pad of the ring of bond pads are similar to bond pads 13 and 15 and are electrically coupled to conductive substrate 12. Bond pad 13 includes a contact or via 24 making electrical contact with conductive substrate 12. A patterned metallization layer 28 is formed to make an electrical connection with via 24. A plating layer 30 is formed over the metallization layer 28. Likewise, bond pad 15 includes via 26, metallization layer 38, and plating layer 40. Bond pads 13 and 15 are formed using conventional means. In other embodiments, the ring of bond pads may include a different type of bond pad. Solder balls 31 and 37 may be formed on plating layers 30 and 40, respectively. An electrical connection comprising via 25, metallization layer 32, plating layer 34, and solder ball 33 functions to electrically connect back plate 20 to, for example, a fixed DC (direct current) potential or AC (alternating current) ground of an amplifier circuit. Likewise, microphone diaphragm 22 includes a bond pad 36 and solder ball 35 for electrically connecting microphone 22 to a terminal of the amplifier circuit.

MEMS microphone 10 requires the opening in the second side, or back side, of cavity 14 to be closed. To close, or cover, the second side opening in cavity 14, the second side (back side) includes a commonly available dry dielectric film 17 that is attached to the second side of substrate 12 as illustrated in FIG. 2. The dry dielectric film may come in rolls so it can be rolled onto the backside of a silicon wafer comprising many conductive die. In one embodiment, the dielectric film is photosensitive and patterned to remove the dielectric film in scribe streets of the silicon wafer (not shown) in preparation for dicing. Dry dielectric film 17 is about 100 microns thick in the illustrated embodiment. Although pliable for purposes of rolling, dry dielectric film spanning 200 microns to 1000 microns is sufficiently rigid for a microphone application. A metal layer 19 is formed over dry dielectric film 17 and electrically contacts substrate 12. The electrical connection of metal layer 19 to substrate 12 can be accomplished in a number of ways. For example, in the illustrated embodiment, dielectric film 17 has been removed in dicing areas between the die on a wafer known as scribe streets. When applied to a wafer before dicing, metal layer 19 electrically contacts substrate 12 in the scribe street areas. In one embodiment, metal layer 19 comprises a relatively thin aluminum plate having an adhesive on one side to adhere it to dielectric dry film 17. Metal layer 19 functions to providing shielding for the second side opening of cavity 14. In another embodiment, metal layer 19 may be a different type of metal or other conductive material suitable for providing shielding over cavity 14.

Figure 3:
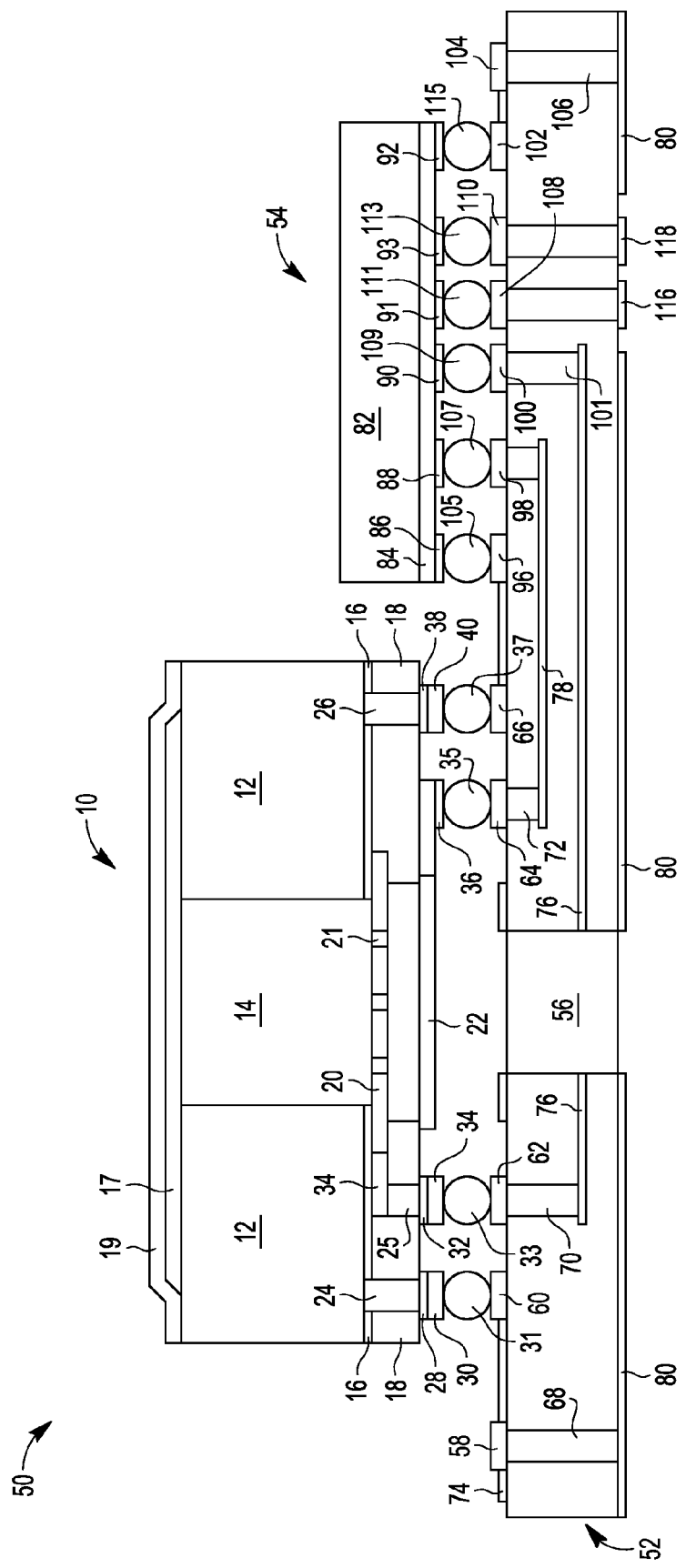
FIG. 3 illustrates a cross-sectional view of an embodiment of the MEMS device of FIG. 2 mounted on a printed circuit board (PCB) with another integrated circuit.

FIG. 3 illustrates a cross-sectional view of an embodiment of the MEMS device of FIG. 2 mounted on PCB 52 with another integrated circuit 54. MEMS microphone 10 is preferably flip-chip mounted on PCB 52 as illustrated in FIG. 3. The plurality of bond pads and solder balls on microphone 10 are connected to corresponding bond pads on PCB 52. For example, the solder balls, such as solder ball 31, are re-flowed to make an electrical and physical connection with, for example, pad 60 of PCB 52. Solder ball 33 electrically connects to bond pad 62, solder ball 35 connects to bond pad 64, and solder ball 37 connects to bond pad 66. PCB 52 includes a number of patterned metal layers for forming conductors for routing signals including conductors 76 and 78. A via 70 connects pad 62 to conductor 76 and a via 72 connects pad 64 to conductor 78. A patterned metal layer on the top side of PCB 52 forms a patterned shield plane 74. A patterned metal layer on the bottom side of PCB 52 forms a patterned shield plane 80. The ring of bond pads used for shielding, including pads 30 and 40, are connected to the patterned shield planes 74 and 80. Vias 68 and 106 connect bond pads 58 and 104, respectively, to shield plane 80. Therefore, all of the parts that comprise the shielding for microphone 10 are electrically connected together and preferably grounded.

Another integrated circuit (IC) 54 is flip-chip mounted to PCB 52. An acoustic hole 56 is provided to allow sound to enter microphone 10. In one embodiment, IC 54 includes an amplifier for amplifying signals produced by microphone 10. As illustrated in FIG. 3, IC 54 includes a substrate 82, interconnect layer 84, pads 86, 88, 90, 91, 93, and 92. As described above regarding MEMS microphone 10, pads 86 and 92 may be part of a ring of pads used to shield the electronic circuits, such as an amplifier, in IC 54 from noise. The ring of bond pads are functionally the same as the ring of bond pads illustrated in FIG. 1. In one embodiment, substrate 82 is highly conductive and is electrically connected to the ring of pads. The ring of pads, including pads 86 and 92, are electrically connected to patterned shield planes 74 and 80. Solder balls 105, 107, 109, 111, 113, and 115 contact pads 86, 88, 90, 91, 93, and 92, respectively. IC 54 is flip-chip mounted to PCB 52 and electrically and physically connected to PCB 52 via corresponding pads 96, 98, 100, 108, 110, and 102. Pad 88 is electrically connected to pad 36 of MEMS diaphragm 22. Pad 90 is electrically connected to pad 34 of backplate 20. Vias connect pads 91 and 93 to PCB pads 116 and 118, respectively, on the back side of PCB 52. PCB pads 116 and 118 function as input/output (I/O) terminals for the amplifier circuit of IC 54.

In operation, IC 54 provides a voltage to pads 34 and 36 of MEMS microphone 10. Diaphragm 22 and backplate 20 function as plate electrodes of a parallel plate capacitor. The capacitor is charged with a capacitance by the voltage provided to bond pads 34 and 36. In one embodiment, the voltage is between 2 and 15 volts DC (direct current). Sound waves travel through acoustic hole 56 and cause diaphragm 22 to move or vibrate back and forth due to pressure changes. In another embodiment, the sound waves may travel between the bond pads of the ring of bond pads. As diaphragm 22 moves back and forth, the distance between diaphragm 22 and backplate 20 changes. The capacitance increases as the distance decreases, and the capacitance decreases as the distance increases. The changing capacitance is sensed by the amplifier of IC 54. Undesirable electrostatic noise can be generated by many sources, including other components mounted on PCB 52, and is shielded from diaphragm 22 by the metal cage comprised of the ring of bond pads, metal layer 19, conductive substrate 12, metal layer 19, and patterned shield planes 74 and 80. Shielding the microphone in this manner eliminates the need for a separate cover over the microphone, thus reducing size and cost of the microphone.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A device comprising:
    a conductive substrate having a first side and a second side, the second side opposite the first side;
    a micro electro-mechanical systems (MEMS) structure formed over the first side of the conductive substrate; and
    a plurality of bond pads formed over the first side of the conductive substrate and electrically coupled to the first side of the conductive substrate;
    wherein the device is flip-chip mounted to a printed circuit board (PCB), and wherein each of the plurality of bond pads is electrically coupled to a ground terminal of the PCB, and
    wherein the PCB further comprises a patterned metal layer coupled to the ground terminal of the PCB, and wherein the patterned metal layer, the plurality of bond pads, and the conductive substrate together form an electrostatic noise shield around the MEMS structure.

2. The device of claim 1, wherein the conductive substrate further comprises a cavity directly opposite the MEMS structure.

3. The device of claim 2, wherein the MEMS structure includes a diaphragm for a microphone.

4. The device of claim 1, further comprising a second device flip-chip mounted to the PCB, the second device comprising a second conductive substrate.

5. The device of claim 1, wherein the PCB further comprises an acoustic hole positioned to admit sound to the microphone diaphragm.

6. The device of claim 1, wherein the conductive substrate has a resistivity of less than or equal to 0.02 ohm-centimeter.

7. The device of claim 1, wherein the conductive substrate comprises doped silicon.

8. A device comprising:
   a conductive substrate having a first side and a second side, the second side opposite the first side, a cavity formed in the conductive substrate and having an opening on the first side;
   a micro electro-mechanical systems (MEMS) microphone diaphragm formed over the opening on the first side, the MEMS microphone diaphragm electrically isolated from the conductive substrate;
   a microphone backplate formed over and electrically isolated from the MEMS microphone diaphragm on the first side of the conductive substrate; and
   a plurality of bond pads formed over the conductive substrate on the first side and around the MEMS microphone diaphragm, each of the plurality of bond pads electrically coupled to the conductive substrate;
   wherein the device is solder mounted to a printed circuit board (PCB) via the plurality of bond pads, and wherein the PCB further comprises a ground terminal electrically coupled to the plurality of bond pads.

9. The device of claim 8, wherein the conductive substrate comprises doped silicon having a resistivity less than or equal to 0.02 ohm-centimeter.

10. The device of claim 8, wherein the PCB further comprises a patterned metal layer coupled to the ground terminal.

11. The device of claim 8, further comprising an integrated circuit mounted on the PCB, a first terminal of the integrated circuit electrically coupled to the MEMS microphone diaphragm, and a second terminal of the integrated circuit electrically coupled to the microphone backplate.

12. The device of claim 8, wherein the PCB further comprises an acoustic hole positioned to admit sound to the microphone diaphragm.

13. The device of claim 8, wherein the conductive substrate comprises silicon doped with a material from a group consisting of arsenic, antimony, boron, and phosphorus.

* * * * *